United States Patent [19]
Kaneto et al.

[11] Patent Number: 5,284,631
[45] Date of Patent: Feb. 8, 1994

[54] CRUCIBLE FOR MANUFACTURING SINGLE CRYSTALS

[75] Inventors: Takeshi Kaneto; Akio Fujibayashi; Yoshinobu Shima; Kenji Araki, all of Tokyo, Japan

[73] Assignee: NKK Corporation, Tokyo, Japan

[21] Appl. No.: 2,126

[22] Filed: Jan. 7, 1993

Related U.S. Application Data

[63] Continuation of Ser. No. 816,814, Jan. 3, 1992, abandoned.

[51] Int. Cl.$^5$ .............................................. C30B 35/00
[52] U.S. Cl. ................................ 422/248; 156/617.1; 156/620.4; 156/DIG. 64; 422/249
[58] Field of Search ............... 156/617.1, 618.1, 619.1, 156/620.1, 620.4, DIG. 64; 422/248, 249

[56] References Cited

U.S. PATENT DOCUMENTS

| | | | |
|---|---|---|---|
| 3,649,193 | 3/1972 | Deyris | 422/248 |
| 4,246,064 | 1/1981 | Dewees et al. | 156/617.1 |
| 4,528,163 | 7/1985 | Albrecht | 422/249 |
| 4,911,895 | 3/1990 | Kida et al. | 422/249 |
| 4,957,712 | 9/1990 | Shima et al. | 422/249 |
| 5,009,863 | 4/1991 | Shima et al. | 422/249 |

FOREIGN PATENT DOCUMENTS

1-174377  7/1989  Japan .

*Primary Examiner*—Robert Kunemund
*Assistant Examiner*—Felisa Garrett
*Attorney, Agent, or Firm*—Michael N. Meller

[57] ABSTRACT

A crucible including a cylindrical partition member arranged concentrically therein for use in a silicon single crystal growing apparatus. The bottom of the crucible located on the inner side of the partition member has a thickness which is not less than 1.3 times and not greater than 4 times the thickness of the partition member and it also has a porosity which is between 0 and 0.2% in its inner layer and between 0.2 and 15% in its outer layer as compared with the porosity of the partition member which is 0.2% or less. By virtue of the foregoing, a D.F. ratio (ratio of dislocation free) of 80% or over can be expected.

4 Claims, 7 Drawing Sheets

CRUCIBLE FOR MANUFACTURING SINGLE CRYSTALS

This application is a continuation of application Ser. No. 816,814, filed Jan. 3, 1992, now abandoned.

BACKGROUND OF THE INVENTION

1. Field of the Invention

The present invention relates to a silica glass crucible used for the manufacture of silicon single crystals according to the Czochralski method.

2. Description of the Prior Art

The method of manufacturing silicon single crystals according to the Czochralski method has heretofore been in use and it has become substantially a perfect technique.

As is well known, this technique is so designed that after molten silicon starting material has been contained in a silica glass crucible, a silicon seed crystal is brought into contact with the molten silicon surface and simultaneously the silicon seed crystal is slowly pulled while rotating it, thus growing a silicon single crystal along with the solidification at the contact surface between the pulled silicon single crystal and the molten silicon surface and thereby producing the cylindrical silicon single crystal.

At this time, in order that the silicon single crystal may become a P-type or N-type semiconductor in accordance with the intended use, the silicon starting material is mixed with a suitable amount of such dopant as boron, antimony or phosphorus. The ratio of such dopant taken into the crystal from the molten silicon (i.e., the segregation coefficient) is generally not greater than 1. The concentration of the dopant in the silicon single crystal determines its resistivity and therefore it should preferably be uniform in the crystal.

Also, besides the dopant which is intentionally introduced into the silicon single crystal as mentioned above, the presence of oxygen introduced unavoidably during the manufacture is not negligible. In other words, the concentration of the oxygen which is introduced into the silicon single crystal has a considerable influence on the characteristics and yield of a semiconductor product and the oxygen concentration should also be uniform throughout the upper part to the lower part of the single crystal.

However, as the pulling of the silicon single crystal proceeds, the molten silicon with the crucible is decreased and the concentration of the impurity is varied. In other words, since the segregation coefficient of the dopant is not greater than the dopant concentration of the molten silicon is increased gradually so that the silicon single crystal is varied in dopant concentration from the upper part to the lower part of the crystal. Also, since the oxygen concentration of the molten silicon is dependent on the amount of the oxygen released from the silica glass crucible into the molten silicon, the concentration of the oxygen introduced into the crystal is also varied with decrease in the molten silicon.

As mentioned previously, the quality of the pulled silicon single crystal is varied along the pulling direction. However, the product actually used as wafers is limited to the portions having dopant concentrations and oxygen concentrations in limited ranges. As a result, the extent of the pulled silicon crystal which can be used as the product is extremely limited.

Some methods have been proposed for the solution of these problems and the typical method which can be considered as practical is one employing a double-structure crucible.

In other words, Japanese Patent Publication No. 40-10184 discloses a method in which a concentric crucible adapted to be heated from the outer periphery thereof is so constructed that the molten silicon in an outer crucible is separated from the molten silicon on the inner side by a partition but the two are mutually communicated and a semiconductor crystal is pulled centrally while feeding the semiconductor starting material to the molten silicon on the outer side.

Figure 10:
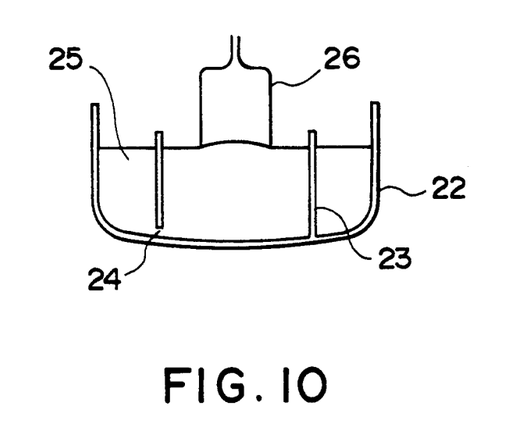
FIG. 10 is a diagram showing an example of a silicon single crystal manufacturing method employing a double structure crucible.

Referring to FIG. 10, there is schematically shown a silicon single crystal manufacturing apparatus employing a double structure crucible, and a crucible 22 and a partition member 23 are constructed integrally by using high-purity silica glass. Numeral 25 designates the molten silicon contained in the crucible 22, and 26 a silicon single crystal pulled from the surface of the molten silicon within the partition member 23. It is to be noted that the lower part of the partition member 23 is formed with a hole 24 to permit the molten silicon 25 to flow between the outer and inner sides of the partition member.

FIG. 10 is a schematic diagram showing the case in which the double structure crucible is incorporated in a batch-type silicon single crystal manufacturing apparatus. The molten silicon of a given dopant concentration is contained on the inner side of the partition member 23 and the molten silicon containing no dopant is contained on the outer side of the partition member 23. It is constructed so that a silicon single crystal 26 is pulled from the single flows to the single crystal growing section from the outer side of the partition member, hereby always maintaining uniform the concentration of the dopant within the single crystal growing section.

Figure 11:
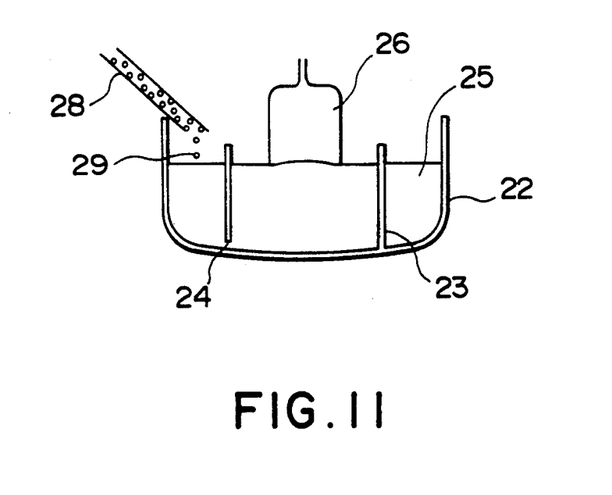
FIG. 11 is a diagram showing another example of the silicon single crystal manufacturing method employing a double structure crucible. In the drawings.

Referring now to FIG. 11, there is illustrated another type of construction in which while pulling a silicon single crystal from the single crystal growing section, powder starting material 29 is continuously fed to the starting material feed section from a starting material feed pipe 28 thereby maintaining constant the amount of the molten silicon within the single crystal growing section, and it has the object of maintaining constant the dopant and oxygen concentrations of the molten silicon in the single crystal growing section.

Where the double structure crucible is used to pull a silicon single crystal in accordance with such conventional technique, the heat environment in the molten silicon becomes directly opposite to the case in which the ordinary single structure crucible is used.

Figure 8:
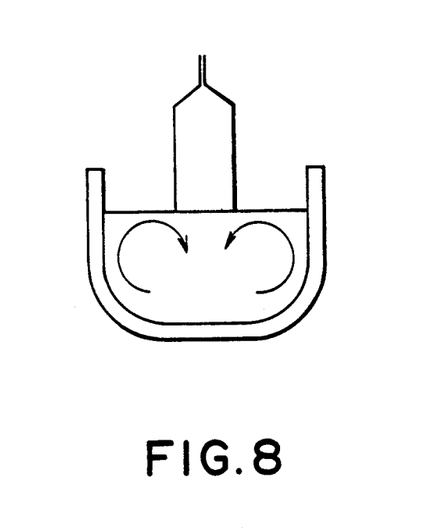
FIGS. 8 and 9 are diagrams respectively showing the convection of molten silicon in cases where a single structure crucible is used and where a conventional double structure crucible is used.
Figure 9:
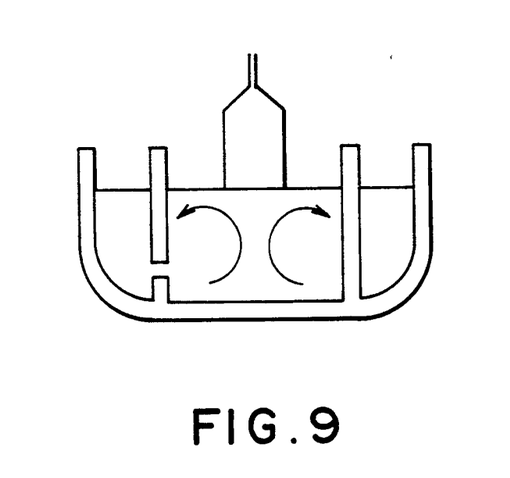

In the case of the CZ method using the ordinary single structure crucible, the crucible side wall portion is higher in temperature than the crucible bottom portion. In other words, the amount of heat supplied from the crucible side wall portion is greater than the amount of heat supplied from the crucible bottom portion. Reflecting this fact, it is said that the convection of the molten silicon within the silica glass crucible is predominated by the flows as shown in FIG. 8. If such convection of the molten silicon, there is less temperature variation at the solid-liquid interface between the silicon single crystal and growth is attained.

Where the pulling of a silicon single crystal is effected by using the double structure crucible, however, the amount of heat supplied to the single crystal growing section through the crucible side is supplied indirectly through the starting material feed section and therefore the proportion of the heat input through the crucible bottom is increased as compared with the case where the single-structure crucible is used. As a result, the temperature distribution in the double structure crucible becomes opposite to the case where the single structure crucible is used and therefore the maximum value of the temperature in the silica glass crucible surrounding the single crystal growing section is positioned at the crucible bottom portion. Its temperature distribution is such that the crucible bottom portion is high in temperature and the partition member wall surface is relatively low in temperature. Under such heat environment where proportion of the heat input through the bottom portion is large, the heat convection of the molten silicon within the single crystal growing section may possibly be predominated by the flow field as shown in FIG. 9 which is directly opposite to that shown in FIG. 8. Since such flow field is unstable, the high-temperature molten silicon at the crucible bottom portion is intermittently moved directly to the solid-liquid interface of the silicon single crystal so that the resulting heat variation causes defects in the silicon single crystal to be pulled and hence the occurrence of dislocations.

On the other hand, the pores included in the silica glass crucible may also be considered as a cause for impeding the stable pulling of the silicon single crystal. In other words, while the surface of the silica glass crucible is subjected to erosion by its reaction with the molten silicon, at this time the pores confined within the silica glass crucible break and enter into the molten silicon thus giving rise to a problem that dislocations are caused when the resulting bubbles and the broken pieces of silica glass the solid-liquid interface of the silicon single crystal.

SUMMARY OF THE INVENTION

The present invention has been made with a view to overcoming the foregoing problems in the art and it is an object of the invention to provide an improved double structure crucible in which the material and thickness at its various parts are optimized so that the heat environment of molten silicon within a single crystal growing section is improved and simultaneously the occurrence of bubbles within the single crystal growing section is reduced, thereby attain into the stable pulling of a silicon single crystal.

The bottom of the crucible portion surrounded by the partition (i.e., the single crystal growing section) is designed to have a thickness which is not less than 1.3 times and not greater than 4 times the thickness of the partition member and also the porosity of the single crystal growing section bottom is greater than the porosity of the partition member. Also, the partition member and the inner surface of the crucible bottom portion of the single crystal growing section are constructed with the same silica glass member having a low porosity not greater than 0.2%.

The amount of heat supplied into the single crystal growing section is determined by the properties and shape of the silica glass member which surrounds it. The crucible bottom portion of the single crystal growing section is increased in thickness for the purpose of reducing the heat input through the crucible bottom portion by utilizing the fact that the heat conductivity of silica glass is not good. In the case of the double structure crucible, if all the parts of the crucible have the same thickness as in the past, the heat flux through the crucible bottom portion becomes excessively large and the heat flux through the partition member becomes excessively small as compared with the case in which the ordinary single structure crucible is used. The reason is that the molten silicon on the outer side of the partition member impedes the heat flow through the side heating zone.

The thickness of the crucible bottom portion of the single crystal growing section is selected not less than 1.3 times of that of the partition member on the ground that the heat environment of the ordinary single structure crucible cannot be realized if the value is not greater than 1.3 times.

However, the heat environment of the CZ Method (the single structure crucible) cannot be attained by merely considering the thickness of the crucible as mentioned above. Assuming that the bottom portion is increased in thickness, the effect of the increased thickness will be reduced greatly if its material is a good heat conductor the amount of heat which enters and leaves through the silica glass includes one due to the heat conductivity and another that is transmitted as a radiant heat. The heat conductivity of the silica glass is on the order of several Kcal/m.h.k. and the heat conductivity is deteriorated with increase in the non-transparency of the silica glass. On the other hand, the transmission of the heat as a radiant heat has a greater dependency on the transparancy of the silica glass and the rate of scattering of the radiant heat is increased with increase in the porosity Of the silica glass, thereby decreasing the transmission. While the heat conductivity can be deteriorated by increasing the bottom portion in thickness, if the bottom portion is transparent to the radiant heat, the effect of restraining the amount of heat transmitted is reduced. The average porosity of the crucible bottom portion of the single crystal growing section is selected to be equal to or higher than that of the partition member in consideration of the foregoing points.

However, it is said that if the crucible bottom portion is made of the silica glass having a high porosity, when the silica glass is heated, the pores existing within the silica glass are expanded so that as the melting of the quartz surface proceeds, the bubbles and the broken pieces of the silica glass are discharged into the molten silicon thus causing the occurrence of dislocations in the silicon single crystal. The inner surface of the crucible bottom portion of the single crystal growing section is made of the low porosity silica glass for the purpose of avoiding such phenomenon.

In addition, the thickness of the bottom of the single crystal growing section is selected to be not greater than 4 times the thickness of the partition member on the ground that if the thickness of the impossible to satisfactorily melt the silicon starting material loaded into the crucible at the start of the operation.

The porosity of the partition member is selected to be not greater than 0.2% for the purpose of facilitating the heat input to the single crystal growing section through the side and thereby ensuring the required amount of the heat input. In other words, since the amount of heat passed through the partition member is reduced if it is made of the silica glass having a high porosity, the thickness of the crucible bottom portion must be further increased correspondingly and it also becomes impossible to ensure the required amount of the heat input to the single crystal growing section.

In the method of pulling a silicon single crystal by using a silicon single crystal growing silica glass crucible in which a partition member is arranged internally so as to concentrically surround a crystal and the partition member is formed with a small hole to permit the movement of the molten silicon from the outerside to the inner side of the partition member, the thicknesses of the various parts of the silica glass crucible are optimized so that the heat environment within the single crystal growing section improved and the heat convection of the molten silicon is stabilized.

On the other hand, since the heat transmission of the silica glass component is practically dependent on the porosity of the silica glass and the heat transmission is increased with decrease in the porosity, by selecting the porosity of the partition member to be lower than the porosity of the crucible bottom portion, it is possible to increase the amount of heat input through the crucible side (the partition member) as compared with the bottom of the crucible.

Further, by decreasing the porosity of the surface of the silica glass member surrounding the single crystal growing section, it is possible to prevent the occurrence of bubbles.

Numeral 1 designates a crucible, 2 a graphite crucible, 3 silicon starting material, 4 molten silicon, 5 a silicon single crystal, 6 a heater, 8 a chamber, 11 a partition member (inner crucible), 12 a small hole, 30 a crucible side wall portion, 31 a partition member, 32 a crucible bottom portion, 35 a large-diameter crucible, and 36 a small-diameter crucible.

DESCRIPTION OF THE PREFERRED EMBODIMENTS

Figure 1:
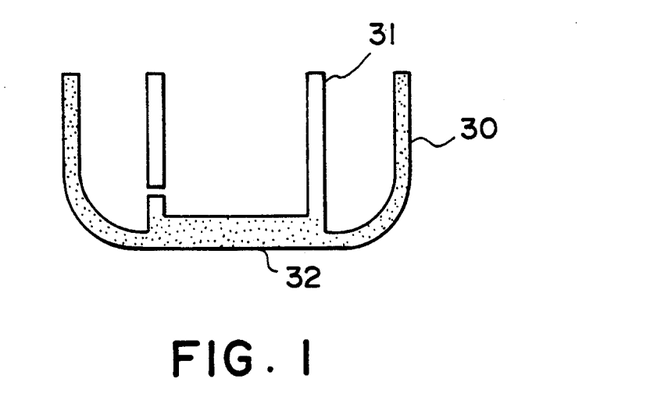
FIGS. 1, 2 and 3 are sectional views showing schematically embodiments of the present invention.

FIG. 1 is a sectional view showing schematically an embodiment of the present invention. In the Figure numeral 30 designates the side wall of a quart crucible, 31 a partition member, 32 the crucible bottom portion of a single crystal growing section.

The partition member 31 is made of a low porosity silica glass having a porosity of not greater than 0.2% and both of the side wall 30 and the crucible bottom portion 32 are made of the ordinary silica glass having a porosity of 0.2% to 15%. The reason for selecting the upper limit of the porosity to be 15% is that if it is greater, the possibility of causing dislocations in the crystal during its pulling becomes extremely high. The thicknesses of the various parts of the crucible are selected so that as for example, the crucible side wall 30 is 10 mm, the partition member 31 is 10 mm and the crucible bottom portion is 20 mm.

Figure 4:
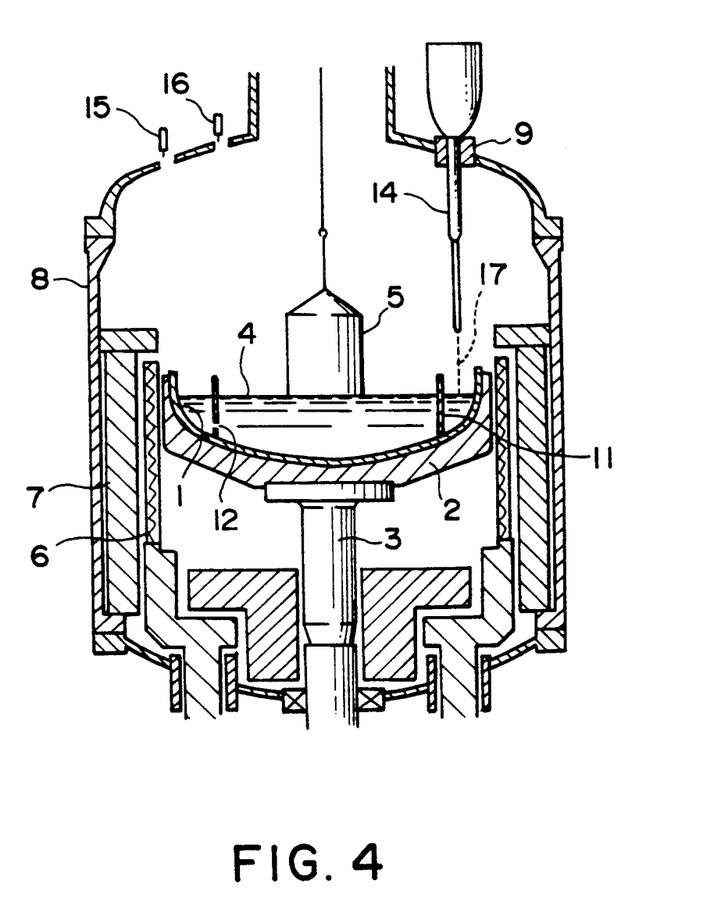
FIG. 4 is a sectional view showing schematically an example of a silicon single crystal pulling apparatus used for incorporating the present invention.

FIG. 4 is a sectional view of an apparatus on the whole which is used for pulling a silicon single crystal by use of such silica glass crucible as described above. Numeral 1 designates a silica glass crucible set in a graphite crucible 2 which in turn is vertically movable and rotatably supported on a pedestal 3. Numeral 4 designates silicon starting material contained in the crucible 1 so that a silicon single crystal 5 grown into a cylindrical shape is pulled from the silicon starting material 4. Numeral 6 designates a heater surrounding the graphite crucible 2, and 7 a hot zone heat insulator surrounding the heater 6, with these components being basically the same with the single crystal manufacturing apparatus according to the ordinary Czochralski method.

With this apparatus, when the double structure silica glass crucible as shown in FIG. 1 is used, the amount of heat supplied through the bottom portion of the single crystal growing section is restrained and contrary the amount of heat supplied through the side portion (the partition member) is increased, thereby ensuring the stable convection of the molten silicon.

Figure 5:
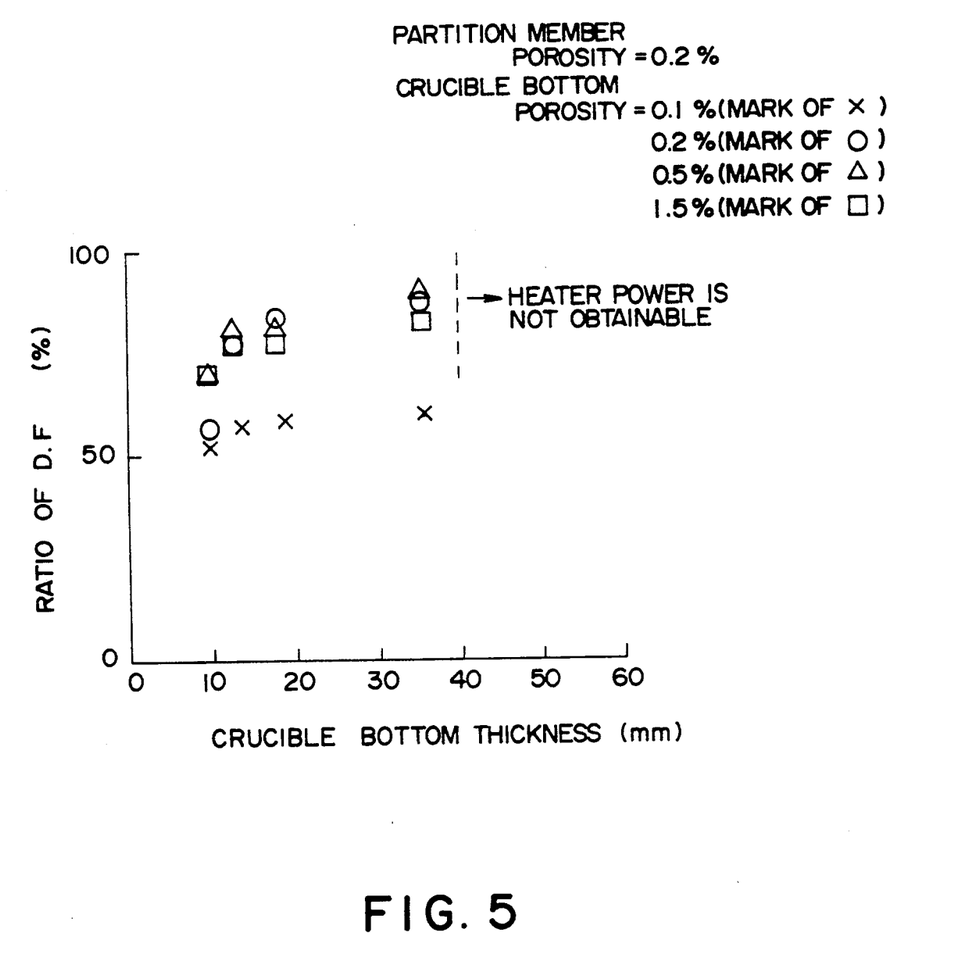
FIGS. 5, 6 and 7 show the results of the experiments on the embodiments of the present invention.
Figure 6:
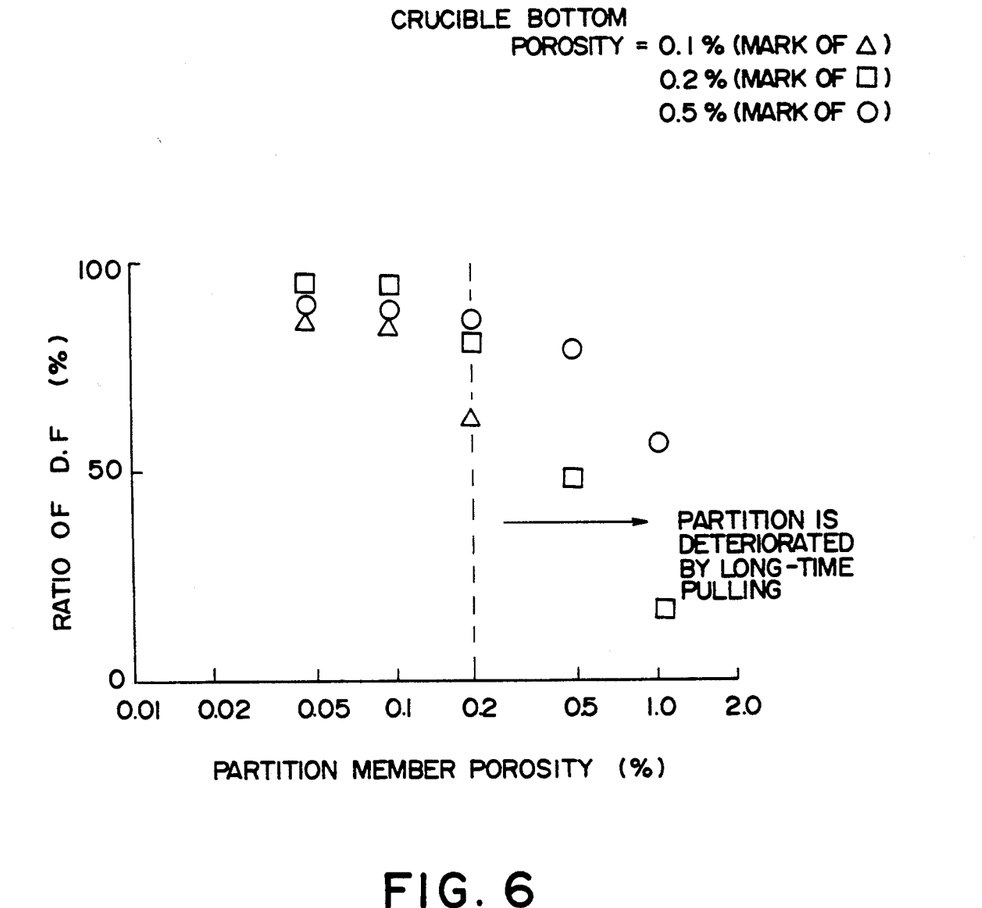

FIGS. 5 and 6 show the results of the experiments conducted by the inventors to confirm the effect of the embodiment as shown in FIG. 1. FIG. 5 shows the relation between the thickness of the crucible bottom portion and the D.F. (dislocation free) ratio in a case where the partition member and the partition outer side portion are both 10 mm in thickness, the porosity of the partition member is 0.2% and the porosity of the crucible bottom portion is varied to 0.1, 0.2, 0.5 and 1.5%, respectively. Ratio of D.F. (Ratio of Dislocation Free) is defined as a probability (acceptance) of pulling without defect, silicon crystal over the length of 1 m during the work of pulling thereof. That is, when the accepted product of defect free silicon crystal over the length of 1 m during 10 times work is 5 times, the Ratio of D.F. is 50%.

As will be seen from FIG. 5, the presence of a problem has been confirmed that if the thickness of the crucible bottom portion is not greater than 13 mm, there is no restraining effect on the heat input through the crucible bottom portion thus failing to attain the stable pulling of a silicon single crystal, whereas if the thickness is not less than 40 mm, the heat input through the crucible bottom portion is reduced excessively thus failing to melt the starting material silicon at its heating and melting stage. Also, where the porosity is 0.1 which is less than that of the partition member, the stable pulling is not attainable even if the crucible thickness is not less than 13 mm.

FIG. 6 shows the relation between the porosity of the partition member and the D.F. ratio in a case where the partition member and the partition outer side portion have the same thickness of 10 mm, the thickness of the crucible bottom portion is 13 mm and the porosity of the crucible bottom portion is varied to 0.1%, 0.5% and 0.2%, respectively. As will be seen from the Figure, it has been found out that if the porosity of the partition member exceeds the average porosity of the crucible bottom portion, the stable pulling of a silicon single crystal is impeded. Also, while essentially the stable pulling is possible if both the partition member and the crucible bottom portion have the same porosity of 0.5%, in cases where the porosity is not less than 0.2%, the long-term pulling of 30 hours or over causes deterioration of the silica glass thus tending to cause dislocations in the crystal.

Figure 2:
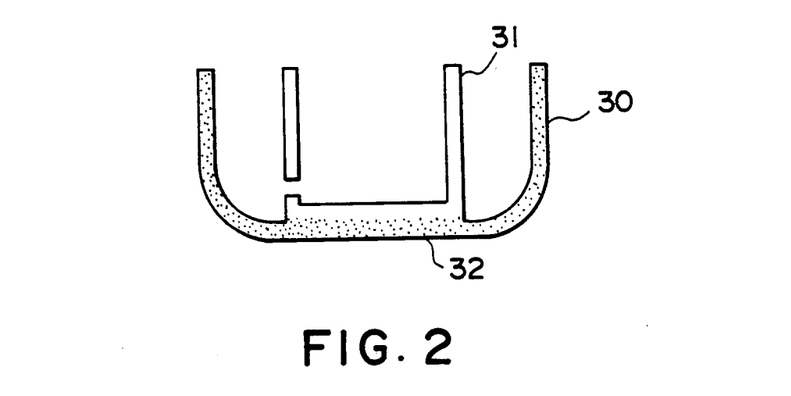

The embodiment of FIG. 2 is intended to overcome the foregoing problems and it is designed so that the outer surface of the crucible bottom portion of the single crystal growing section is made of a high porosity silica glass and its inner surface is made of a low porosity silica glass.

Figure 7:
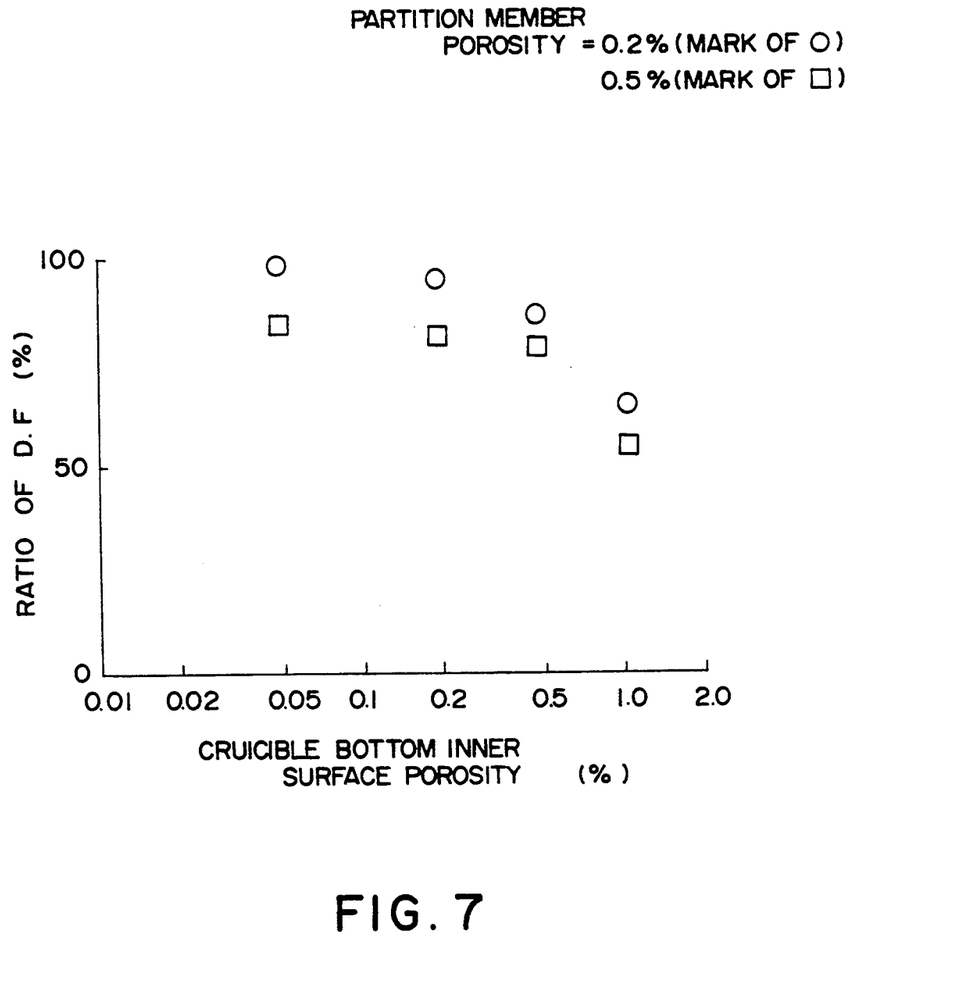

FIG. 7 shows the results of the experiments conducted to confirm the effect of the embodiment of FIG. 2. FIG. 7 shows the relation between the porosity of the crucible bottom inner surface and the D.F ratio in a case where the long-term pulling (over 30 hours) is effected by selecting the thicknesses of the partition member and the crucible outer side portion 10 mm, selecting the thickness of the crucible bottom portion 20 mm, varying the porosity of the partition member to 0.2% and 0.5%, respectively, and selecting the porosity of the crucible bottom outer side 1.2%. As will be seen from the Figure, it has been confirmed that if the porosity of the crucible bottom inner surface is not greater than 0.2%, the stable pulling of a silicon single crystal is attainable in the long-term pulling. Further, if the low porosity layer on the inner surface of the crucible bottom portion is not greater than 2 mm, there is the possibility of this layer being partially melted and lost and the stable pulling cannot be performed.

The upper limit is selected to be 13 mm on the ground that if it is made thicker than this, there is the danger of excessively increasing the heat input through the bottom. It is to be noted that in the case of the two layer construction, the porosity of the crucible bottom can be defined as the average value of the porosities of the inner surface and the outer side and the discussions of FIGS. 5 and 6 hold on the basis of this average value.

Figure 3:
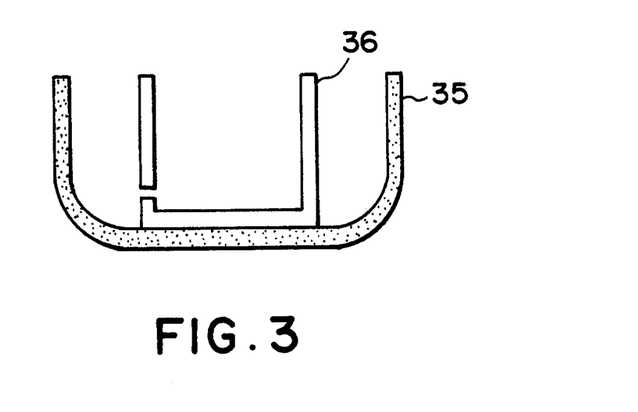

The fusing operation of the double structure crucible as shown in FIG. 2 is performed as a part of the crucible manufacturing operation and the fusing of the silica glass members at various parts can also be effected by the amount of heat supplied during the melting of the silicon starting material. The embodiment of FIG. 3 comprises a double structure crucible constructed by using a large-diameter crucible having a high porosity and a small-diameter crucible 36 having a low porosity and fusing the bottom outer surface of the small-diameter crucible and the bottom inner surface of the large-diameter crucible to each other, thereby obtaining substantially the same effect as the embodiment of FIG. 2.

As will be seen from the foregoing description, the present invention is such that in the silicon single crystal manufacturing method employing the double structure crucible the amount of heat supplied through the side of the single crystal growing section is increased over that supplied through the bottom so that not only the stable heat convection of the molten silicon is ensured but also the occurrence of bubbles from the silica glass is prevented, thereby attaining the stable pulling of a silicon single crystal. Thus, working of the present invention has a great effect.

What is claimed is:

1. A silicon single crystal manufacturing apparatus comprising a crucible containing molten silicon and a partition member arranged inside said crucible in contact with a bottom portion of said crucible for forming a single crystal growing section from which a single crystal is pulled, said bottom portion of said crucible having a thickness which is not less than 1.3 times and not greater than 4 times the thickness of said partition member and a porosity, at least where said bottom portion is in contact with molten silicon, of greater than the porosity of said partition member with said partition member having a porosity of not greater than 0.2% and at least one hole in a lower part thereof.

2. A silicon single crystal manufacturing apparatus as defined in claim 1, wherein the crucible is composed of a quartz silica glass.

3. A silicon single crystal manufacturing apparatus as defined in claim 2, wherein the crucible bottom portion of said single crystal growing section comprises an inner layer in contact with said molten silicon and an outer layer said inner layer having a thickness of between 2 mm and 13 mm and a porosity of not less than 0.2% and not greater than 15%.

4. A silicon single crystal crucible according to claim 3, wherein said inner layer of said crucible bottom portion in said single crystal single crystal growing section and said partition member are made of the same silica glass.

* * * * *